US011626893B2

United States Patent
Eller et al.

(10) Patent No.: US 11,626,893 B2
(45) Date of Patent: Apr. 11, 2023

(54) AGILE HARMONIC FILTERING

(71) Applicant: Harris Global Communications, Inc., Rochester, NY (US)

(72) Inventors: Andrew Eller, Naples, NY (US); Jarrod Adams, Rochester, NY (US)

(73) Assignee: HARRIS GLOBAL COMMUNICATIONS, INC., Rochester, NY (US)

( * ) Notice: Subject to any disclaimer, the term of this patent is extended or adjusted under 35 U.S.C. 154(b) by 188 days.

(21) Appl. No.: 17/214,104

(22) Filed: Mar. 26, 2021

(65) Prior Publication Data
US 2022/0311461 A1 Sep. 29, 2022

(51) Int. Cl.
*H04B 1/04* (2006.01)
*H03H 7/01* (2006.01)

(52) U.S. Cl.
CPC ......... *H04B 1/0475* (2013.01); *H03H 7/0115* (2013.01); *H04B 2001/0408* (2013.01)

(58) Field of Classification Search
CPC .............. H03H 7/0153; H03H 7/0115; H03H 2210/025; H04B 1/0458; H04B 1/18; H04B 2001/0408; H04B 1/1036; H04B 1/10; H04B 1/1027; H04B 1/40; H04B 1/56; H04B 1/0475; H04B 1/04; H04B 1/16; H04B 1/401
See application file for complete search history.

(56) References Cited

U.S. PATENT DOCUMENTS

| | | | |
|---|---|---|---|
| 5,065,121 A | 11/1991 | Ghadaksaz | |
| 5,917,387 A | 6/1999 | Rice et al. | |
| 5,963,856 A | 10/1999 | Kim | |
| 6,239,675 B1 | 5/2001 | Flaxl | |
| 8,185,081 B2 | 5/2012 | Russell et al. | |
| 9,129,080 B2 | 9/2015 | Tsuzuki et al. | |
| 9,712,197 B2 * | 7/2017 | Ripley | ................. H04B 1/1036 |
| 2005/0206482 A1 | 9/2005 | DuToit et al. | |

OTHER PUBLICATIONS

P. Katzin and B. Bedard, "A VHF switched-capacitor band-pass filter using GaAs MESFET IC technology," 15th Annual GaAs IC Symposium, San Jose, CA, USA, 1993, pp. 243-245, doi: 10.1109/GAAS.1993.394460.

(Continued)

*Primary Examiner* — Diana J. Cheng
(74) *Attorney, Agent, or Firm* — Fox Rothschild LLP; Carol Thorstad-Forsyth; Robert Sacco

(57) ABSTRACT

Reducing harmonics in a radio transmitter can involve using an electronically tunable harmonic filter (ETHF) in a transmit path at the output of an RF power amplifier stage to reduce harmonic signal components in the RF transmit signal. At least one filter characteristic of the ETHF is selectively controlled using one or more RF switch. The one or more RF switches that are used to control the ETHF can include a CMOS-SOI and/or a MEMs type of switch. Various filter characteristics of the ETHF can be controlled including a bandwidth and/or a center frequency of the ETHF.

26 Claims, 8 Drawing Sheets

(56) References Cited

OTHER PUBLICATIONS

Ming-Chan Hong, Wen-Chi Wu and Chrong-Kuang Wang, "A double-MOSFET switched-capacitorauto-tuned high frequency filter," Proceedings of IEEE International Symposium on Circuits and Systems—ISCAS '94, London, UK, 1994, pp. 603-606 vol.5, doi: 10.1109/ISCAS.1994.409448.

A. el Oualkadi, M. el Kaamouchi, J. Paillot, D. Vanhoenacker-Janvier and D. Flandre, "Fully Integrated High-Q Switched Capacitor Bandpass Filter with Center Frequency and Bandwidth Tuning," 2007 IEEE Radio Frequency Integrated Circuits (RFIC) Symposium, Honolulu, HI, USA, 2007, pp. 681-684, doi: 10.1109/RFIC.2007.380974.

M. Hemon, F. Domingue, A. Kouki, V. Nerguizian and F. Gagnon, "Band 3+ RF MEMS micro switch and its application to a high power tunable filter," 2009 IEEE Radio and Wireless Symposium, San Diego, CA, USA, 2009, pp. 642-645, doi: 10.1109/RWS.2009.4957433.

* cited by examiner

AGILE HARMONIC FILTERING

BACKGROUND

Statement of the Technical Field

The technical field of this disclosure concerns radio communication systems and more particularly methods and systems for improving performance of such systems using agile radio frequency filtering.

Description of the Related Art

In the field of radio frequency (RF) communications, a harmonic signal is one that has a frequency that is an integer multiple of an intended signal. Most radio transmitters will internally generate at least some harmonic signals that are multiples of the intended transmission frequency, and this can be a problem as harmonics are known to be a potential cause of RF interference with other devices. Accordingly, the inclusion of harmonic filters is commonly necessary in radio transmitters to satisfy transmitter design specifications relating to unwanted spurious transmissions.

A bandwidth of a harmonic filter is generally limited based on frequency octaves (an octave being the interval between two frequencies having a ratio of 2:1). As a consequence of this constraint, many such harmonic filters may be needed in the case of a single multiband transmitter to provide harmonic filtering over many different operating bands.

SUMMARY

This document concerns a method and system for reducing harmonics in a radio transmitter. The method involves increasing a power level of a radio frequency (RF) transmit signal in a final RF power amplifier (PA) stage, and using an electronically tunable harmonic filter (ETHF) in a transmit path at the output of the RF PA stage to reduce harmonic signal components in the RF transmit signal. According to one aspect, at least one filter characteristic of the ETHF is selectively controlled using at least one RF switch. In a transmitter system as described, the RF switches that are used to control the ETHF can in some scenarios include a CMOS-SOI and/or a MEMs type of switch. According to one aspect, the filter characteristic which is controlled can include a bandwidth and/or a center frequency of the ETHF.

In accordance with certain aspects of a solution described herein, the radio transmitter can be operable on at least a first frequency band and a second frequency band which are at least one octave apart. In such a scenario, the center frequency of the ETHF can be selectively controlled with said RF switches to provide, in a first mode, harmonic filtering of the RF transmit signal in the first frequency band, and in a second mode, harmonic filtering of the RF transmit signal in the second frequency band.

According to one aspect, the filter characteristic which is controlled can include an input impedance and/or an output impedance of the ETHF. If a scenario in which the input impedance ETHF is controlled dynamically controlled, such control can be exercised to maximize power transfer from the RF PA stage to the ETHF. In other scenarios in which an output impedance of the ETHF is dynamically controlled, such control can be exercised to maximize power transfer from the ETHF to an antenna.

The radio transmitter can be part of a transceiver system including a radio receiver. In such a scenario, the method can further involve using the ETHF to filter received signals before they are communicated to an input of the radio receiver. For example, in some scenarios at least one filter characteristic of the ETHF can be dynamically varied or modified when the transceiver system is transitioned between a transmit mode in which the transmitter is active and a receive mode in which the receiver is active. Here, the characteristic of the ETHF which is varied can be a filter center frequency, a filter bandwidth, an input impedance of the filter and/or an output impedance of the filter.

The method can also include actions to reduce an interaction of the at least one RF switch with the RF transmit signal. For example, such unwanted interaction can be reduced by interposing or connecting at least one capacitor component between the at least one RF switch and an RF transmit signal path. Similarly, parasitic effects of at least one inductor component can be reduced. However, in the case of inductor components parasitic effects can be advantageously reduced by interposing the RF switch between the at least one inductor component and the RF transmit signal path.

In some scenarios the method can involve using a plurality of the RF switches to control the at least one filter characteristic. In such scenarios, the method can include selecting the RF switches or switch paths that are active (conducting) so as to achieve a particular filter characteristic in a way which also maximizes filter Q.

A radio transmitter implementing the above-described method can include an RF final power amplifier (PA) configured to increase a power level of an RF exciter signal, and an electronically tunable harmonic filter (ETHF) disposed in a transmit path of the transmitter between an output of the RF PA and an antenna port of the radio transmitter. A control unit or processing element is configured to automatically control at least one filter characteristic of the ETHF in accordance with a selected operating band or frequency of the transmitter. For example, the filter characteristic can be controlled using at least one RF switch in the ETHF. In some scenarios, the filter characteristic which is controlled can include a bandwidth and/or a center frequency of the ETHF.

For example, the radio transmitter as described herein can be configured to operate on at least a first frequency band and a second frequency band which are at least one octave apart. In such a scenario the control unit is advantageously configured to select the center frequency of the ETHF using said RF switches to provide, in a first mode, harmonic filtering of the RF transmit signal in the first frequency band, and in a second mode, harmonic filtering of the RF transmit signal in the second frequency band.

According to a further aspect, the at least one filter characteristic which is determined by the control unit can include an input impedance of the ETHF and/or an output impedance of the ETHF. For example, in such a scenario the control unit can be configured to automatically control the input impedance of the electronically tunable filter to maximize power transfer from the RF PA stage to the ETHF. Alternative or in addition thereto, the control unit can be configured to automatically control an output impedance of the ETHF to maximize power transfer from the ETHF to an antenna.

Further, certain aspects of the solution described herein can be implemented as part of a transceiver system. The transceiver system can include the radio transmitter as described herein and can further include a radio receiver having an input. In such a scenario, the ETHF can be advantageously configured to filter received signals before they are communicated to the input of the radio receiver.

Further, the control unit in such a transceiver can be configured to dynamically vary at least one filter characteristic of the ETHF when the transceiver system is transitioned between a transmit mode in which the transmitter is active and a receive mode in which the receiver is active. In such a scenario, the filter characteristic which is varied can include one or more of a center frequency, a bandwidth, an input impedance and an output impedance of the ETHF.

In an ETHF as described herein at least one capacitor component of the ETHF is advantageously connected between the at least one RF switch used to vary the characteristics of the ETHF and an RF transmit signal path defined within the ETHF. Further, at least one RF switch used to vary the characteristics of the ETHF can be connected between at least one inductor component and the RF transmit signal path. The control unit can in some scenarios control a plurality of the RF switches of the ETHF in such a way to provide the at least one filter characteristic. In such scenarios, the control unit can be advantageously configured to select the plurality of RF switches that are active so as to achieve a particular filter characteristic in a way which also maximizes filter Q.

BRIEF DESCRIPTION OF THE DRAWINGS

This disclosure is facilitated by reference to the following drawing figures, in which like reference numerals represent like parts and assemblies throughout the several views. The drawings are not to scale and are intended for use in conjunction with the explanations in the following detailed description.

DETAILED DESCRIPTION

Figure 1:
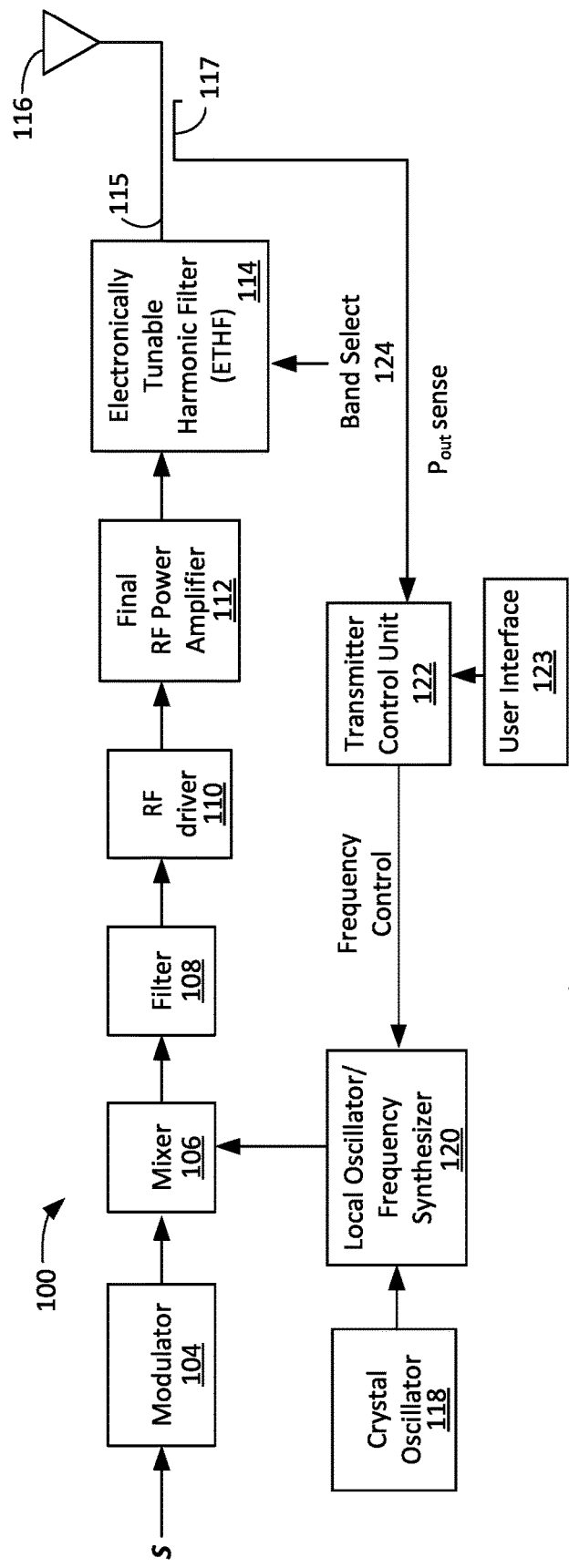
FIG. 1 is a block diagram that is useful for understanding a transmitter architecture which includes an electronically tunable harmonic filter.

It will be readily understood that the solution described herein and illustrated in the appended figures could involve a wide variety of different configurations. Thus, the following more detailed description, as represented in the figures, is not intended to limit the scope of the present disclosure, but is merely representative of certain implementations in various different scenarios. Further, particular features described herein can be used in combination with other described features in each of the various possible combinations and permutations. It is noted that various features are described in detail with reference to the drawings, in which like reference numerals represent like parts and assemblies throughout the several views. While the various aspects are presented in the drawings, the drawings are not necessarily drawn to scale unless specifically indicated.

Radio transmitters require some means for controlling or minimizing transmission of harmonic signals which are produced in the final RF amplifier. The usual solution to this problem is to include a low-pass or band-pass harmonic filter at the output of the final RF amplifier. The harmonic filter reduces unwanted harmonics from the transmit signal before the signal is passed to a transmitting antenna. Due to its location in the high power output transmit path, harmonic filters must be capable of handling relatively high voltage.

In order to facilitate its harmonic filter function, the bandwidth of a conventional harmonic filter is generally limited to operating over a frequency range of less than one octave. But modern multiband transmitters are designed to operate over many frequency octaves. Accordingly, harmonic filtering of transmit signals over all possible transmit bands may require many different filters.

The need to include numerous harmonic filters in a multiband transmitter increases transmitter form factor and increases manufacturing costs. The necessary placement of harmonic filters in the high power output path of a transmitter also places certain constraints upon the type of filter that can be used. For example, the filters used in the high power transmit path must have low insertion loss for in-band transmit signals. Such low insertion loss is essential when implementing harmonic filters or else the transmitter will be inefficient.

In the past, the use of an electronically tunable filter in a high power transmitter output path has been impractical. This is mainly due to certain performance limitations of conventional electronically tunable RF filter designs. For example, conventional varactor tunable filters have a high insertion loss. These types of filters can also be difficult to control because they exhibit non-linearities in the presence of high power RF signals. But in recent years, new technologies have emerged. For example, in recent years new transistors have become available based on complementary metal-oxide-semiconductor (CMOS) and silicon on insulator (SOI) technology, which is sometimes referred to as CMOS-SOI. Microelectromechanical systems (MEMS) have also advanced greatly in recent years. It has been determined that one or both of these technologies can facilitate implementation of filters that are electronically tunable and satisfy all of the necessary technical requirements for harmonic filters disposed in the transmitter high-power output path.

In particular, it has been determined that an electronically tunable filter can be implemented using new technologies (such as CMOS-SOI and/or MEMs) to selectively switch a plurality of reactive elements into or out of a filter circuit. Such switches have low internal resistance, are independently controllable, offer a high degree of linearity, and are capable of withstanding high peak voltages. Consequently, an electronically tunable harmonic filter can be provided which is suitable for use in the high power transmit path after the final PA stage of a transmitter. Use of such an electronically tunable harmonic filter in the high-power transmitter output path has many advantages.

Referring now to FIG. 1 it can be observed that a radio frequency (RF) transmitter 100 can comprise several components such as a modulator 104, a mixer 106, a filter 108, an RF driver 110, a final RF power amplifier (PA) 112, antenna port 115, crystal oscillator 118, and a local oscillator (LO) 120 which may be implemented in the form of frequency synthesizer. Various aspects of the operation of the transmitter can be managed by a transmitter control unit 122, which may be a suitable processing unit such as a microcontroller or a microprocessor programmed with a set of instructions. The transmitter control unit can be responsive to one or more user inputs received at a user interface 123 to control a frequency of signals generated by LO 120 to control the transmitter output frequency.

According to one aspect of a solution described herein, the transmitter includes a harmonic filter 114 which is configured to remove harmonic signal components from an output of a final RF power amplifier 112. As such, the harmonic filter can comprise a bandpass filter or a low pass filter. The electronically tunable harmonic filter (ETHF) 114 is advantageously disposed in a transmit path of the transmitter through which high power RF energy is communicated from the final RF power amplifier 112 to the antenna port 115, where it is coupled to an antenna 116. In the transmitter 100, the ETHF is disposed between an output of the RF PA and the antenna port. In some scenarios described herein, an RF coupler 117 can be used to sense power output from the ETHF and a sensed output signal Pout from the coupler can be communicated to the transmitter control unit 112.

Transmitter control unit 122 is configured to control at least one filter characteristic of the ETHF 114. The at least one filter characteristic is controlled based on or in accordance with a selected operating band or frequency of the transmitter. As explained below in further detail, the at least one filter characteristic is advantageously controlled by selectively controlling at least one RF switch in the ETHF 114. The at least one filter characteristic referenced herein can include one or more of a bandwidth and a center frequency of the ETHF. The at least one filter characteristic can in some scenarios also or alternatively include an input impedance of the ETHF and/or an output impedance of the ETHF.

Figure 2:
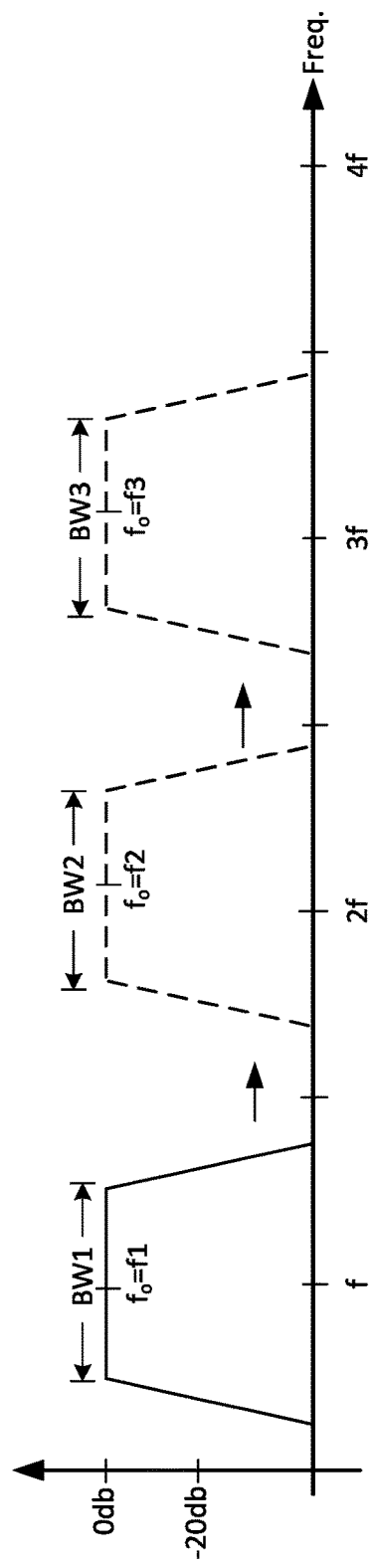
FIG. 2 is a diagram that is useful for understanding how an electronically tunable harmonic filter can be transitioned under different conditions to have a different center frequency and different bandwidth.

According to a further aspect, the radio transmitter 100 can be operable on at least a first frequency band and a second frequency band which are at least one octave apart. In such a scenario the center frequency $f_o$ of the ETHF is selectively controlled with one or more RF switches to facilitate operations on different radio frequencies and/or different RF bands. For example, the ETHF can be controlled by the transmitter control unit 122 so as to provide, in a first mode, harmonic filtering of the RF transmit signal in the first frequency band, and in a second mode, harmonic filtering of the RF transmit signal in the second frequency band. The first and second frequency band can be at least one octave apart. Further operating modes are possible in which harmonic filtering is facilitated for at least a third operating band which is at least one octave apart from the first and second frequency bands. The foregoing concept is illustrated in FIG. 2, which shows that ETHF in a first operating mode can be configured to have a center frequency $f_o=f1$ and a bandwidth BW1 to facilitate harmonic filtering of high power RF energy on a first transmitter frequency band. In a second operating mode the ETHF can be configured to have a different center frequency $f_o=f2$ and a bandwidth BW2 to facilitate harmonic filtering of transmit signals on a second transmitter frequency band. Similarly, the ETHF can in a third operating mode have a center frequency $f_o=3f$, and a bandwidth of BW3 to facilitate harmonic filtering on a third transmitter frequency band. In some scenarios, the ETHF can be configured to provide harmonic filtering for a greater or lesser number of frequency bands.

Figure 3:
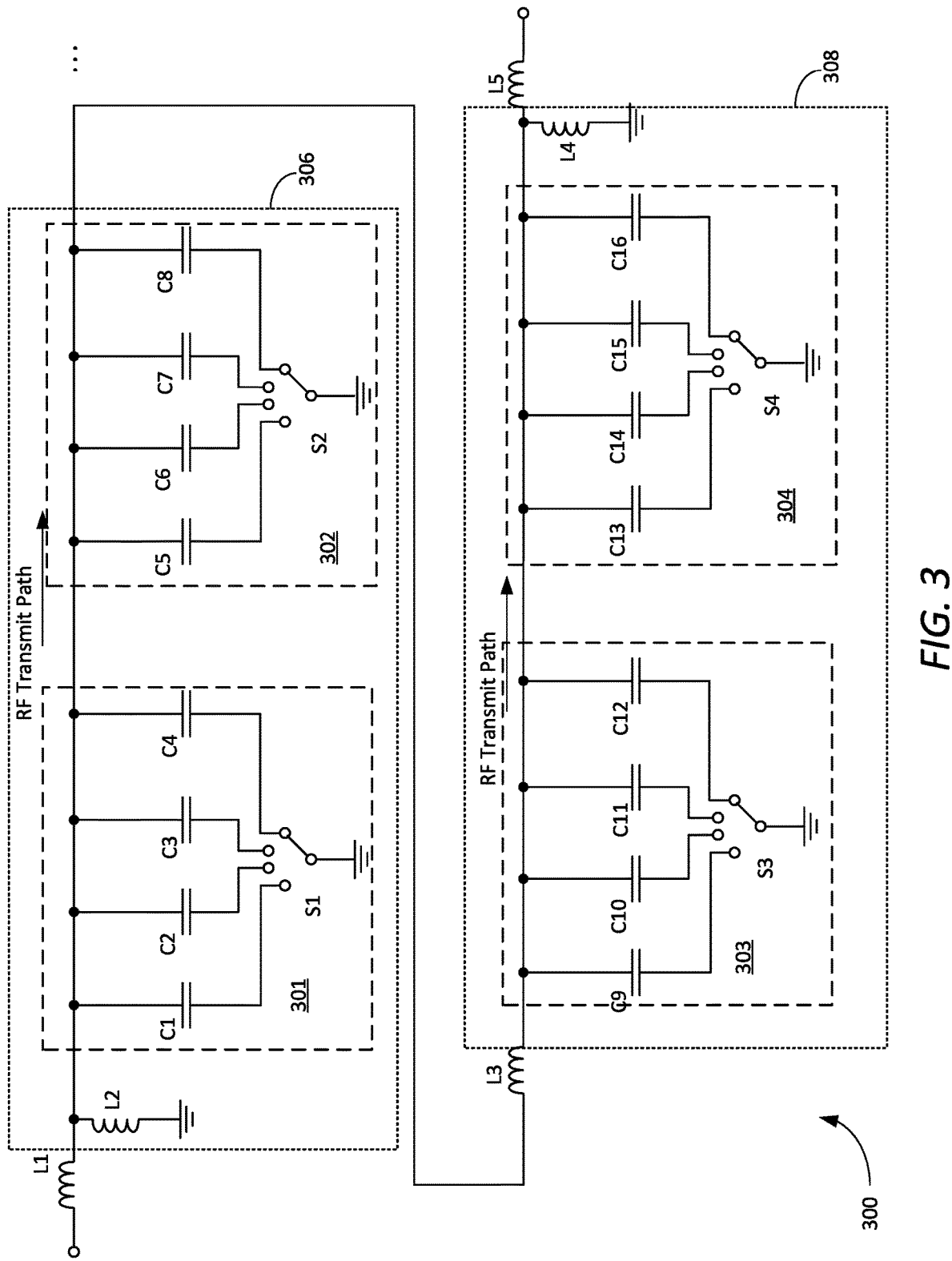
FIG. 3 is a schematic diagram that is useful for understanding how electronically controlled switches can be used in an electronically tunable harmonic filter.

Shown in FIG. 3 is an example of an ETHF 300 implemented using four electronically controlled RF switches S1, S2, S3, S4, and a plurality of passive reactive components. The reactive components include series inductors L1, L3, L5 and shunt inductors L2, L4. The reactive components also include a plurality of shunt capacitor elements C1-C16. The reactive components comprise tuned LC circuits 306, 308. In this scenario, the shunt capacitors are arranged in four switched element banks 301, 302, 303, 304, each respectively including a switch. In the ETHF 300 each switch S1-S4 is capable of selecting one capacitor from a particular bank to include in the filter circuit. The reactive components in this example are arranged to define a tee network bandpass filter. However, the particular filter topology shown in FIG. 3 is merely illustrated as one possible example and is not intended to limit the scope of the embodiments disclosed herein. Other filter types (e.g. low-pass), filter topologies (e.g., a pi topology), and filters with more or fewer filter poles, are also possible without limitation. Further, although the filter topology shown uses banks of capacitors to form the various tuned LC circuits, the invention is not limited in this regard. In some scenarios, switches S1-S4 can be used to control one or more banks of inductors. In still other scenarios, switches can be used to control one or more banks of inductors and one or more banks of capacitors. Switched elements (inductors and/or capacitors) can be included or excluded from the filter circuit by controlling the switches.

Figure 4:
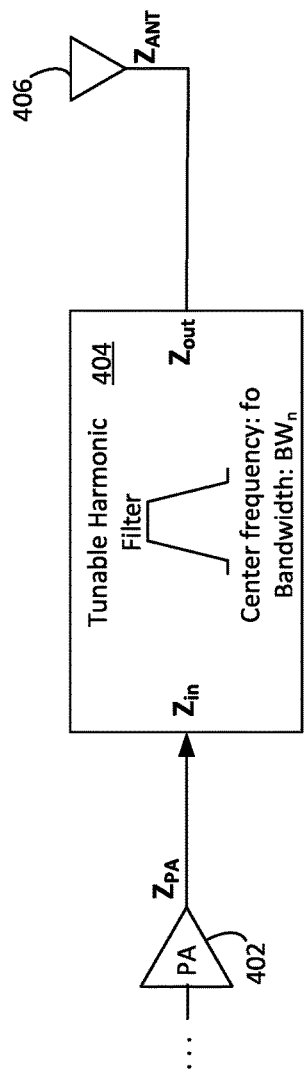
FIG. 4 is a block diagram that is useful for describing how an input and output impedance of an electronically tunable harmonic filter can be modified to facilitate various operating conditions.

According to one aspect, the one or more switches in an ETHF can be electronically controlled to selectively vary one or more electrical characteristics of the filter. By forming electrical connections to different predetermined reactive components (capacitors C1-C16 in this example) suitable harmonic filters for various different transmitter frequency bands can be selectively or dynamically implemented. For example, as shown in FIG. 4, the switches can be used to vary a center frequency $f_o$, bandwidth BW, input impedance $Z_{in}$, and output impedance $Z_{out}$ of the filter.

Harmonic filter implementations for different frequency bands will require different filter center frequencies. Further, in some instances different filter bandwidths can be advantageous. Accordingly, dynamic control over these filter characteristics can be desirable in a multiband transmitter. However, selective control of filter input and/or output impedance can also be important in a multiband transmitter. In particular, output impedance $Z_{PA}$ of a final RF power amplifier and input impedance $Z_{ANT}$ of an antenna can sometimes vary from band to band. Accordingly, control of input and output impedance of the ETHF can be useful for maximizing power transfer. Specifically, by controlling the input impedance of the ETHF, power transfer can be maximized from the final RF power amplifier to ETHF. Similarly, by controlling the output impedance of the ETHF, power transfer can be maximized from the ETHF to the antenna. Therefore in some scenarios input and output impedance can be selected for a particular frequency band in accordance with switch settings which are predetermined (e.g., factory preset switch settings for each frequency and/or frequency band). In other scenarios the optimal input and/or output impedance values can be dynamically controlled. For example, power output of the ETHF can be monitored, and switch settings of the ETHF can be automatically dynamically adjusted by a transmitter control unit to maximize power transfer for transmissions at each band.

Referring again to FIG. 3, the electronic control of various filter characteristics of an ETHF 300 can be facilitated by using electronically controlled switches. By varying the switch position, a transmitter control unit can selectively include or exclude various different reactive elements (inductors or capacitors) from the filter circuit by connecting or disconnecting them to electrical ground. Further, it may be noted in FIG. 3, that the switches S1-S4 are each disposed in the filter circuit between a capacitor element and ground. The solution is not limited in this regard, but the configuration shown is advantageous. In particular, the impedance of capacitors C1-C16 in each case can help isolate each switch from RF energy in the RF transmit path. Consequently, any negative effects of the switch on filter electrical performance will be minimized. Such negative effect can be due for example to non-linearities or loss associated with the switches. Accordingly, in any of the various filter topologies which may be used to implement the ETHF (e.g., a pi or tee topology), it is advantageous for the one or more switches to be disposed between the capacitor and ground.

Depending on frequency of operation, inductors used in many scenarios can be significantly larger in physical size as compared to capacitors. This size difference can potentially create a scenario where the footprint of the inductor on the surface of a printed wiring board (PWB) is relatively large. Further, due to its relatively large physical size, the inductor can often have significantly higher parasitic response characteristics as compared to capacitors used in the design. Consequently, positioning inductor elements directly off the primary RF signal path has the potential to negatively impact filter Q. To minimize this effect, it can be advantageous to arrange the filter topology so that the switches in each instance are placed between the primary RF signal path and the inductor (which may be connected to ground). This arrangement is illustrated with regard to the shunt inductors shown in the various filters of FIGS. 6-8. The configuration of the inductors and switches as shown has a benefit that is similar to placing the capacitors between the primary RF signal path and the switches as described above. In both scenarios, loss is minimized.

Figure 5:
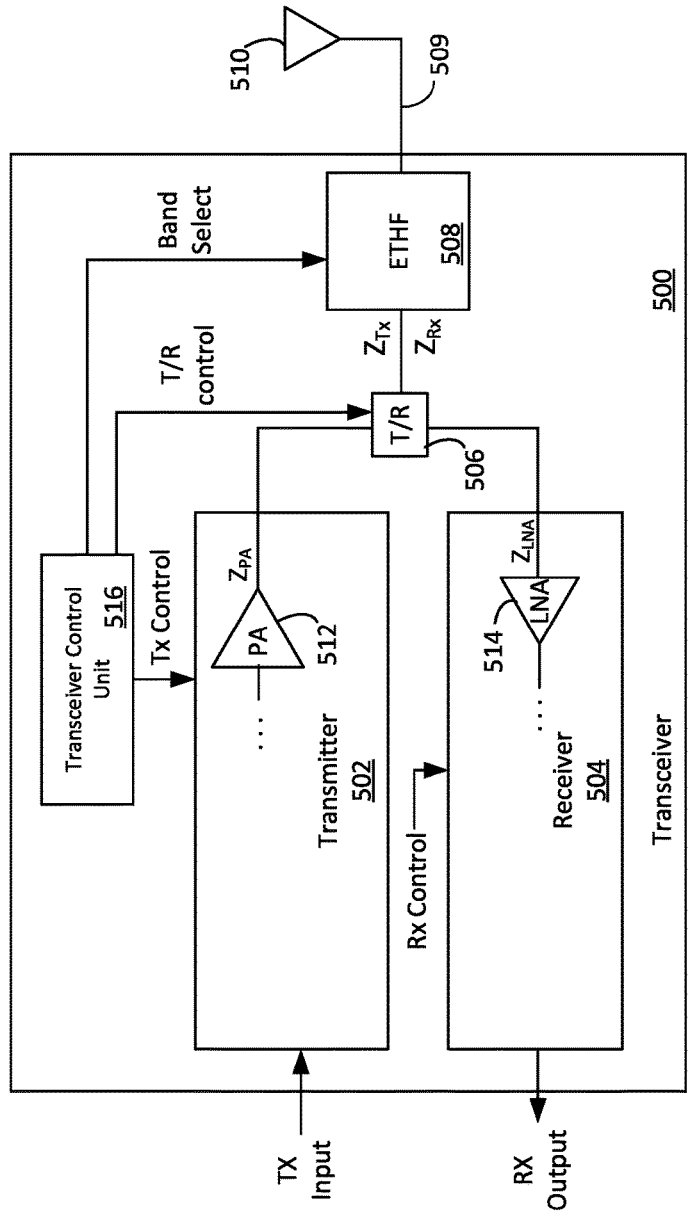
FIG. 5 is block diagram that is useful for understanding a transceiver implementation incorporating an electronically tunable harmonic filter.

Certain implementations thus far have been described above in the context of a radio system comprising a transmitter. However, it should be understood that various embodiments can also include solutions in which the radio system comprises a transceiver. Such a configuration is shown in FIG. 5. The transceiver 500 in such a scenario includes a transmitter 502, a receiver 504, a transmit/receive (T/R) switch 506, and an ETHF 508. The transceiver can include a transceiver control unit 516 which may be a microcontroller, microprocessor or other type of processing unit controlled by suitable firmware or software. The transmitter can include a final power amplifier 512 coupled to the T/R switch. The receiver 504 can include a low noise amplifier 514 or other suitable receive circuitry to facilitate receiving radio signals. The T/R switch can operate under the control of the transceiver control unit 516 to selectively connect the transmitter or the receiver to the ETHF 508 in accordance with an operating mode. The output of the ETHF is connected to antenna 510 through an output port 509.

In the scenario shown in FIG. 5, the ETHF 508 is used as described herein to filter spurious harmonic signals from the output of the transmitter. However, when the transceiver 500 is in a receive mode, the ETHF 508 can also be used to filter received signals from antenna 510 before such signals are communicated to an input of the receiver 504. Accordingly, the ETHF 508 can function as a preselector which filters out certain unwanted signals in the receive signal communicated from antenna 510. The low loss nature of the ETHF as described herein allows the ETHF to serve in this role without adverse effect upon receiver performance.

It will be appreciated that there may be some scenarios where an optimal preselector filter in the receive path will have different filter characteristics as compared to a harmonic filter that is used in a transmit path. With an ETHF as described herein, the filter characteristics can be adjusted or modified to optimize performance in each operating mode. In other words, a transceiver control unit 516 can dynamically vary at least one filter characteristic of the ETHF 508 when the transceiver system is transitioned between a transmit mode in which the transmitter is active and a receive mode in which the receiver is active. The filter characteristic that is varied can be a filter center frequency, bandwidth, input impedance and/or output impedance. In some scenarios, the filter characteristic in transmit and/or receive mode can be varied in accordance with a particular modulation scheme that is being applied for communications purposes.

Inductive and capacitive type reactive elements are commonly used to implement harmonic filters. For example, each pole of a bandpass filter will commonly comprise an inductive and a capacitive element which together comprise an LC resonant circuit or tuned circuit. In FIG. 3, the capacitive portion of each LC resonant circuit 306, 308 can be implemented by one or more banks. In the example shown in FIG. 3, resonant circuit 306 is comprised of banks 301, 302, and resonant circuit 308 is comprised of banks 303, 304. Each bank 301, 302, 303, 304 is controlled by one of the switches S1-S4. The switches can connect any one of the capacitors in a particular bank to ground. The switches can also be controlled so that none of the capacitors in a particular capacitor bank are connected to ground in a particular filter implementation.

Figure 6:
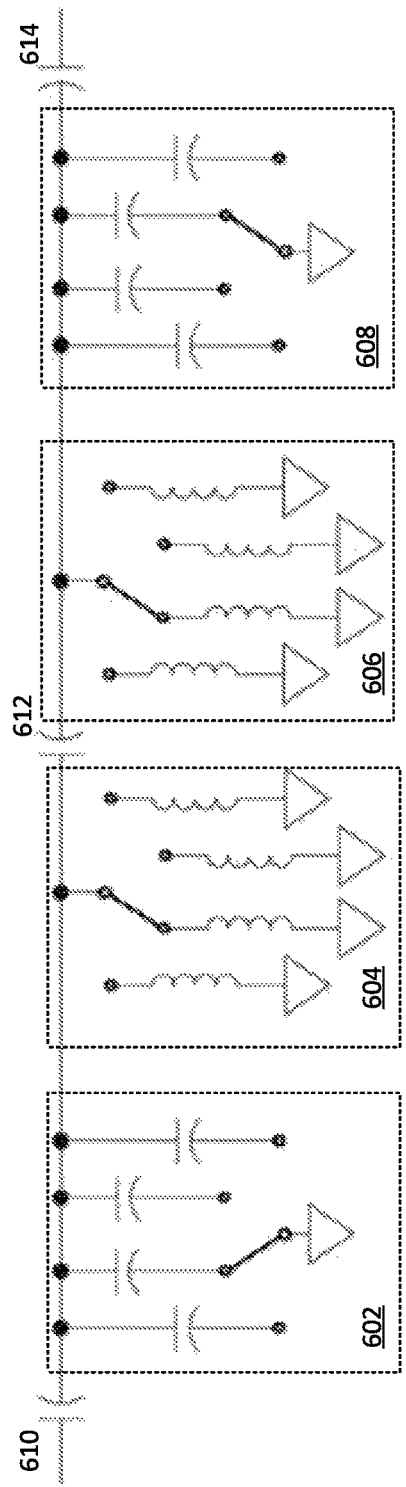
FIG. 6 is a schematic diagram which is an example of a first alternative filter topology.
Figure 7:
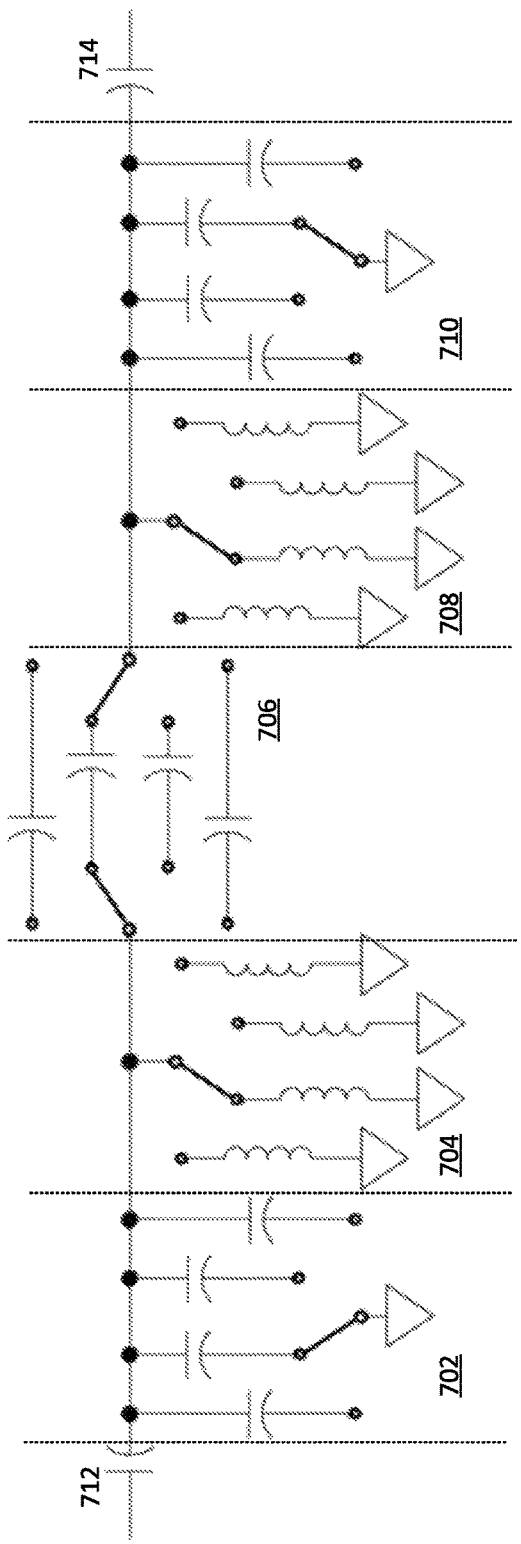
FIG. 7 is a schematic diagram which is an example of a second alternative filter topology.
Figure 8:
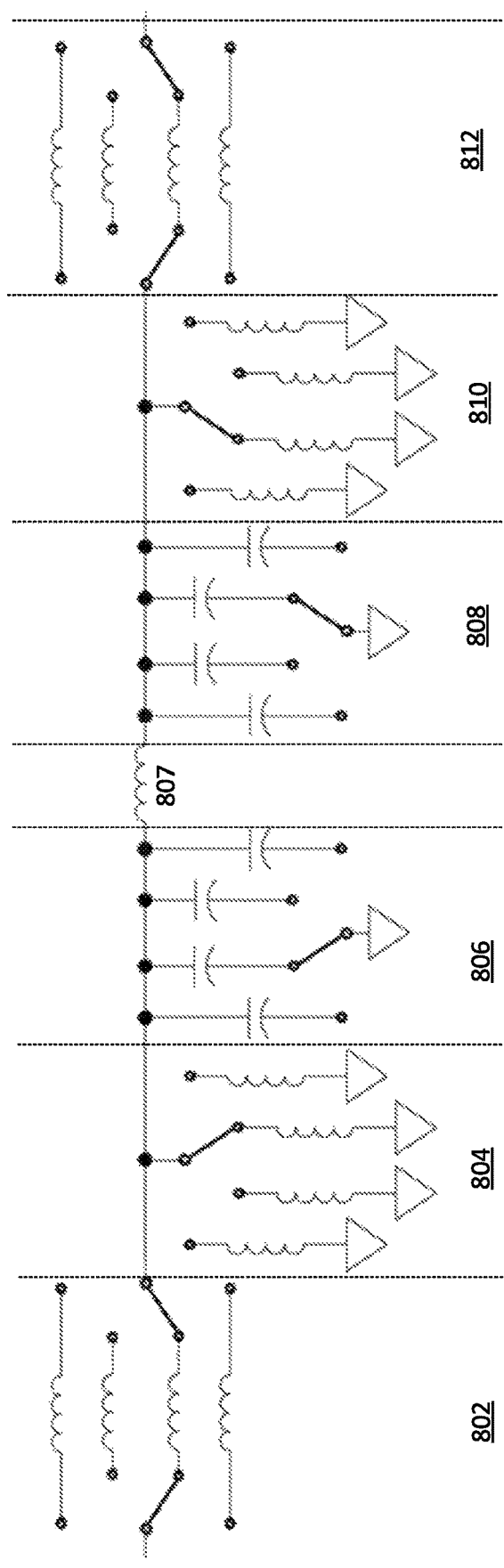
FIG. 8 is a schematic diagram which is an example of a third alternative filter topology.

Alternative configurations of switched elements in various filter topologies are shown and discussed in greater detail in relation to FIGS. 6-8. FIG. 6 shows a topology in which individual switched elements comprising capacitors in banks 602, 608 and individual switched elements comprising inductors in banks 604, 606 are selectively connected to the filter circuit in a shunt configuration between capacitors 610, 612, 614. FIG. 7 shows a similar topology in which individual switched elements comprising capacitors in banks 702, 710 and inductors in banks 704, 708 are selectively connected to the filter circuit in shunt configuration between capacitors 712, 714. But the filter in FIG. 7 further includes switched elements comprising capacitors in bank 706 which are connected in series between inductor banks 704, 708. FIG. 8 shows an example of a further topology in which individual switched elements comprising inductors in banks 802, 812 are selectively connected in the filter circuit in series, and individual switched elements comprising inductors in banks 804, 810 are selectively connected in the filter circuits in a shunt configuration. Switched elements comprising capacitors in banks 806, 808 are selectively connected in the filter circuit in shunt configuration, and connected by inductor 807. The various ETHF topologies shown herein are not intended to be limiting but instead are representative of several possible scenarios of filter circuits in which certain reactive components are switched into and out of the circuit.

According to a further aspect, a transmitter or transceiver control unit and the associated switch configuration can be designed to optimize filter performance. The foregoing concept will now be explained in greater detail in relation to FIG. 9A-9C which shows a switched element bank 901. Switched element bank 901 is similar to each of the switched element banks 301-304 but differs insofar as it includes independent control of each individual switch path $S1_1$, $S1_2$, $S1_3$, $S1_4$. The importance of this independent control of each switch path will be more clearly understood from the discussion below. Further, the switched element bank 901 is also a more accurate model of a switched element bank as it includes an explicit representation of parasitic capacitance $C_{p1}$, $C_{p2}$, $C_{p3}$, $C_{p4}$, and parasitic resistance $R_{p1}$, $R_{p2}$, $R_{p3}$, $R_{p4}$ associated with each switch path. In this more detailed view, it is shown that when a multi-throw RF switch path as $S1_1$, $S1_2$, $S1_3$, or $S1_4$ is active, the parasitic off-capacitance $C_p$, for that switch, reduces to effectively zero and $R_p$ dominates.

The parasitic RF switch characteristics described herein give rise to the need to optimize the capacitance distribution across the switches within a switched element bank so as to improve overall filter Q. Each active switch element (i.e., each switch in an "on" position") in a switched element bank 901 will reduce the total parasitic capacitance $C_p$ and decrease the combined effective ESR (equivalent series resistance) introduced within a particular switched element bank 901. This is due to the fact that the combined effective ESR is dominated by the on-resistance of the switch elements.

Figure 9A:
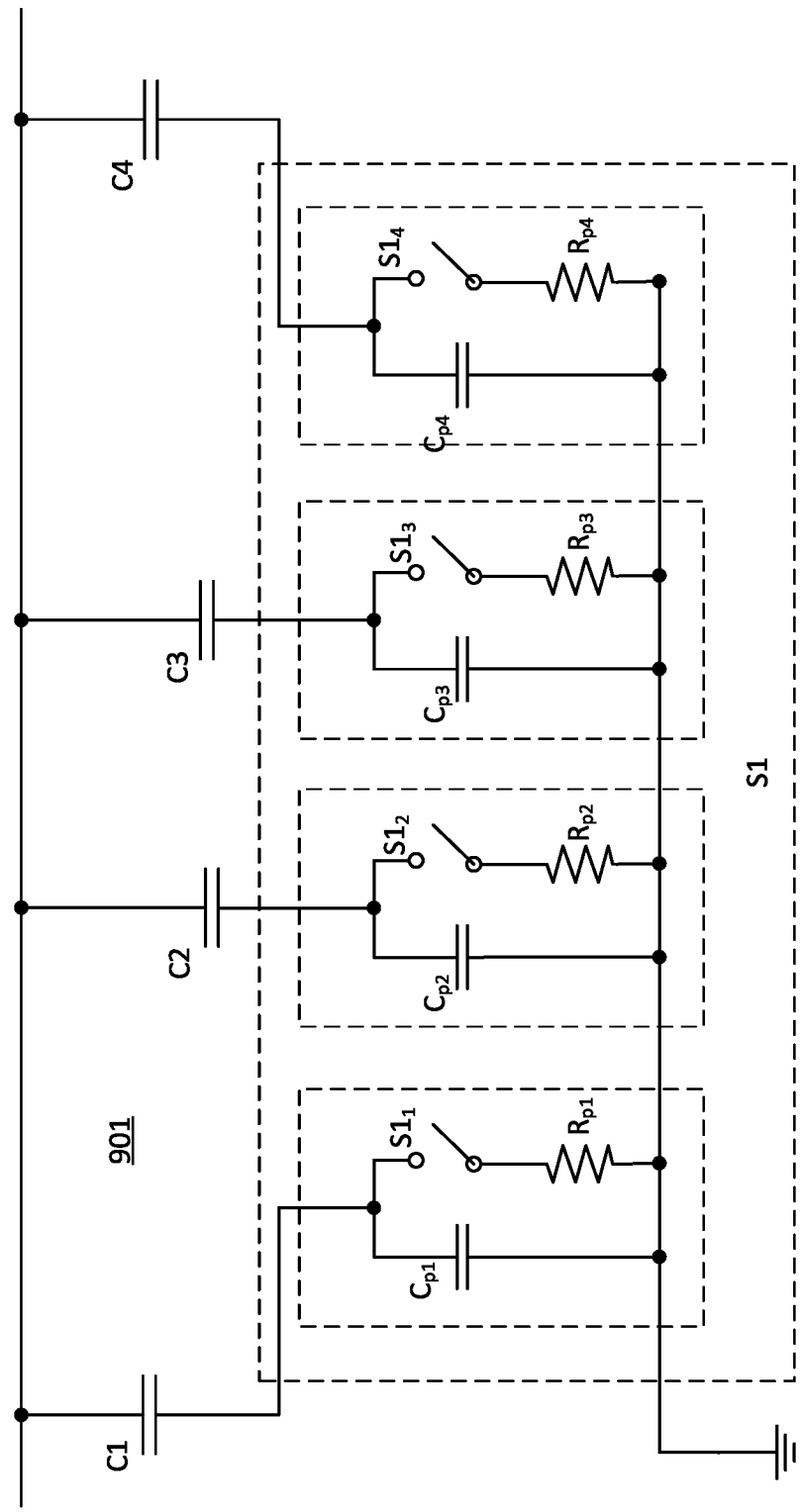
FIGS. 9A-9C are schematic drawings which are useful for understanding the benefits of independent switch control and algorithmic switch selection methods.
Figure 9B:
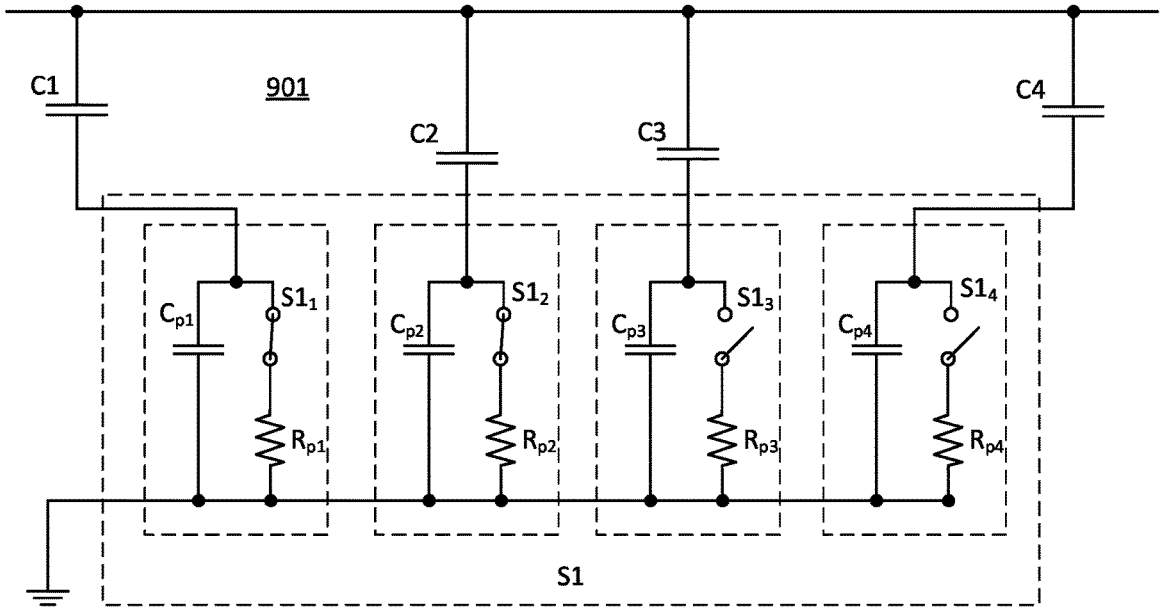
Figure 9C:
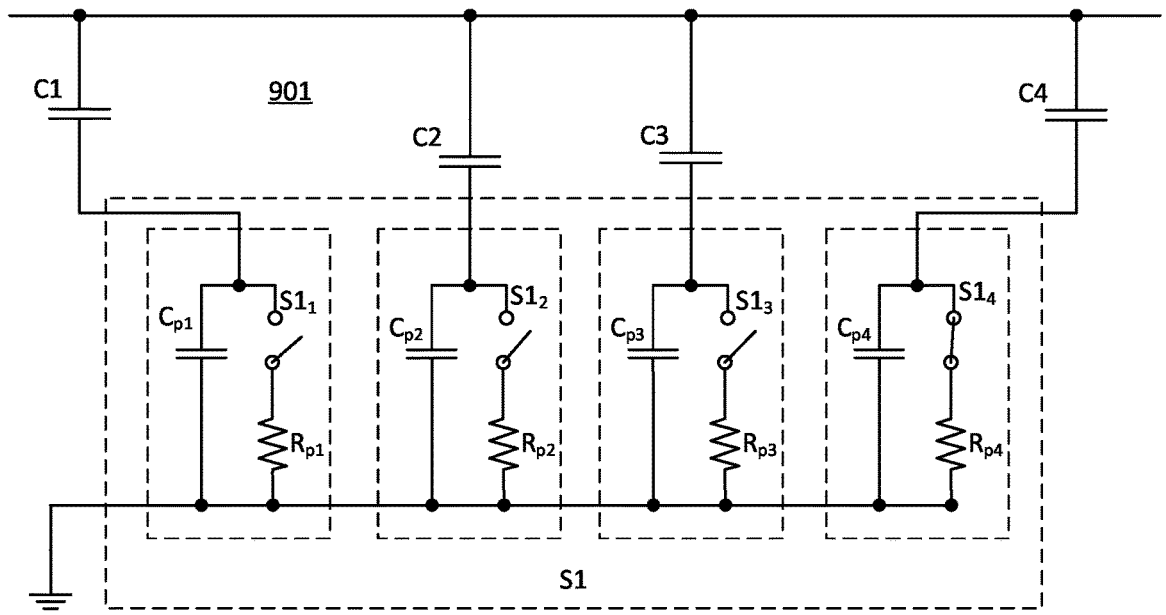

As an example, assume in FIGS. 9A-9C that C1+C2=C4. In this scenario the same total capacitance can be obtained when two-switch elements ($S1_1$, $S1_2$) are active (as shown in FIG. 9B) or when only one-switch element $S1_4$ is active (as shown in FIG. 9C). However, it can be shown that the parallel combination of parasitic resistance $R_{p1}$ and $R_{p2}$ would produce a lower effective ESR in FIG. 9B as compared to the parasitic resistance $R_{p4}$ alone the configuration in FIG. 9C. It can also be shown that the configuration in FIG. 9B would produce less parasitic capacitance as compared to the configuration in FIG. 9C. From the foregoing it may be understood that there can be within a switched element bank a particular combination of switches that may be chosen to optimize Q.

Lower effective ESR and reduced parasitic capacitance result in improved filter Q; concluding in minimized insertion loss. More generally, it has been found that maximum Q can be obtained by selectively implementing the necessary capacitance within a switched element bank by using a carefully designed algorithm or look up table (LUT). The algorithm or LUT will be configured so that switches used to tune the ETHF are activated in such a way that both ESR and parasitic capacitance are minimized. The optimal switch activation methodology has been described herein in the context of a capacitor type of switched element bank 901. However, it should be understood that a similar principal would be applicable to inductor type of switched element bank.

Further, it has been determined that the most effective way to distribute the total capacitance across the switches to improve filter Q is through a weighted approach. For example, the total capacitance required in a particular switched element bank can be divided by the number of switch elements, and then multiplied by weightings centered around a value of 1. In a scenario where there are 8 switch elements, suitable weightings could be 1.8, 1.6, 1.4, 1.2, 0.8, 0.6, 0.4, 0.2.

Figure 10:
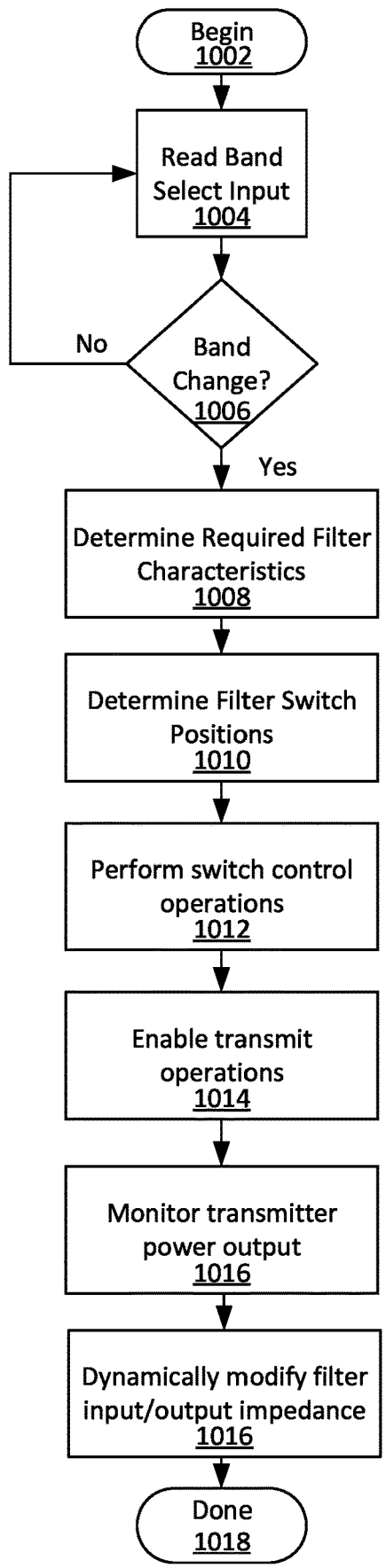
FIG. 10 is a flowchart that illustrates a method for controlling a filter in a multiband transmitter.

FIG. 10 is illustrative of a method for controlling an ETHF in a transmitter. The process begins at 1002 and continues to 1004 where a transmitter control unit reads a band select input from a user interface. At 1006 a determination is made as to whether the user has selected a new operating band. If not (1006: No) then the process returns to 1004 and continues monitoring inputs from the user interface. If a band change is detected (1006: Yes) the process continues on to 1008 and a determination is made as to the required filter characteristics for the particular operating band that has been selected. At 1010 the transmitter control unit can determine the filter switch positions that will be used for implementing the filter. The selection of the filter switch positions can be initially based on predetermined switch position contained in a look up table (LUT) for the particular band that has been selected. These switch settings will establish the filter center frequency, bandwidth, input impedance and output impedance. The switch positions can also be set in accordance with a predetermined scheme or methodology by which filter Q is maximized. In general, this process will involve activating the maximum number of switches in each switch bank (or combination of switch banks) to provide the reactance needed in each LC tuned circuit. The process continues to 1012 where the transmitter control unit performs switch control operations to set the necessary switch positions.

At 1014 the transmitter control unit can enable transmit operations. Optional operations at 1016 and 1018 can be performed to improve transmitter efficiency. For example, transmitter power output at the output of the harmonic filter can be monitored at 1016 by the transmitter control unit and compared to predetermined criteria. If the output power is satisfactory or a satisfactory voltage standing wave ratio (VSWR) is detected, no action may be needed. However, if transmit power and or measured VSWR does not satisfy predetermined criteria, the transmitter control unit can dynamically adjust one or more filter characteristics to maximize transmitter efficiency. For example, input and/or output impedance of the harmonic filter can be selectively modified. More particularly, input impedance of the harmonic filter can be modified to improve an input impedance match with a transmitter final power amplifier. Output impedance of the harmonic filter can be selectively modified to improve an output impedance match with a connected antenna.

Dedicated hardware implementations of a transmitter or transceiver control unit include, but are not limited to, application-specific integrated circuits, programmable logic arrays, and other hardware devices can likewise be constructed to implement the methods described herein. Applications that can include the apparatus and systems broadly include a variety of electronic and computer systems. In some scenarios, certain functions can be implemented in two or more specific interconnected hardware modules or devices with related control and data signals communicated between and through the modules, or as portions of an application-specific integrated circuit. Thus, the exemplary system is applicable to software, firmware, and hardware implementations.

Furthermore, the described features, advantages and characteristics disclosed herein may be combined in any suitable manner. One skilled in the relevant art will recognize, in light of the description herein, that the disclosed systems and/or methods can be practiced without one or more of the specific features. In other instances, additional features and advantages may be recognized in certain scenarios that may not be present in all instances.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

Although the systems and methods have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application. Thus, the breadth and scope of the disclosure herein should not be limited by any of the above descriptions. Rather, the scope of the invention should be defined in accordance with the following claims and their equivalents.

We claim:

1. A method for reducing harmonics in a radio transmitter, comprising:
   increasing a power level of a radio frequency (RF) transmit signal in a final RF power amplifier (PA) stage;
   using an electronically tunable harmonic filter (ETHF) in a transmit path at the output of the RF PA stage to reduce harmonic signal components in the RF transmit signal after the power level has been increased, wherein the ETHF comprises a plurality of resonant circuits and a plurality of passive electronic components arranged in series and in an alternating manner between input and output terminals of the ETHF, each said resonant circuit comprising a plurality of switched element banks which are each provided with at least one RF switch that is able to selectably connect and disconnect each of a plurality of reactive elements to and from electrical ground or a primary path of the RF transmit signal; and
   selectively controlling a position of the at least one RF switch of at least one of the plurality of switched element banks in at least one of the plurality of resonant circuits to change at least one filter characteristic of the ETHF.

2. The method according to claim 1, wherein the at least one filter characteristic is selected from the group consisting of a bandwidth and a center frequency of the ETHF.

3. The method according to claim 2, wherein the radio transmitter is operable on at least a first frequency band and a second frequency band which are at least one octave apart; and
   the center frequency of the ETHF is selectively controlled with said RF switches to provide, in a first mode, harmonic filtering of the RF transmit signal in the first frequency band, and in a second mode, harmonic filtering of the RF transmit signal in the second frequency band.

4. The method according to claim 1, wherein the at least one filter characteristic is selected from the group consisting of an input impedance and an output impedance.

5. The method according to claim 4, wherein the input impedance of the ETHF is dynamically controlled to maximize power transfer from the RF PA stage to the ETHF.

6. The method according to claim 4, wherein an output impedance of the ETHF is dynamically controlled to maximize power transfer from the ETHF to an antenna.

7. The method according to claim 1, further comprising selecting the at least one RF switch from the group consisting of a CMOS-SOI and a MEMs type of RF switch.

8. The method according to claim 1, wherein the radio transmitter is part of a transceiver system including a radio receiver, and the method further comprises using the ETHF to filter received signals before they are communicated to an input of the radio receiver.

9. The method according to claim 8, further comprising dynamically varying at least one filter characteristic of the ETHF when the transceiver system is transitioned between a transmit mode in which the transmitter is active and a receive mode in which the receiver is active.

10. The method according to claim 9, wherein the at least one filter characteristic is selected from the group consisting of a center frequency, a bandwidth, an input impedance and an output impedance.

11. The method according to claim 1, further comprising reducing an interaction of the at least one RF switch with the RF transmit signal by interposing at least one capacitor component between the at least one-RF switch and an RF transmit signal path.

12. The method according to claim 11, further comprising reducing parasitic effects of at least one inductor component by interposing the at least one RF switch between the at least one switched inductor component and the RF transmit signal path.

13. The method according to claim 1, wherein a plurality of RF switches are used to control the at least one filter characteristic, and the method further comprises selecting the RF switches that are active so as to achieve a particular filter characteristic in a way which also maximizes filter Q.

14. A radio transmitter, comprising:
   a radio frequency (RF) final power amplifier (PA) configured to increase a power level of an RF exciter signal;
   an electronically tunable harmonic filter (ETHF) disposed in a transmit path of the transmitter between an output of the RF PA and an antenna port of the radio transmitter, the ETHF comprising a plurality of resonant circuits and a plurality of passive electronic components arranged in series and in an alternating manner between input and output terminals of the ETHF, each said resonant circuit comprising a plurality of switched element banks which are each provided with at least one RF switch that is able to selectably connect and disconnect each of a plurality of reactive elements to and from electrical ground or a primary path of the RF transmit signal;
   a control unit configured to automatically control a position of the at least one RF switch of at least one of the plurality of switched element banks in at least one of the plurality of resonant circuits to change at least one filter characteristic of the ETHF in accordance with a selected operating band or frequency of the transmitter.

15. The radio transmitter according to claim 14, wherein the at least one filter characteristic is selected from the group consisting of a bandwidth and a center frequency of the ETHF.

16. The radio transmitter according to claim 15, wherein the radio transmitter is configured to operate on at least a first frequency band and a second frequency band which are at least one octave apart; and
   the control unit is configured to select the center frequency of the ETHF using said RF switches to provide, in a first mode, harmonic filtering of the RF transmit signal in the first frequency band, and in a second mode, harmonic filtering of the RF transmit signal in the second frequency band.

17. The radio transmitter according to claim 14, wherein the at least one filter characteristic is selected from the group consisting of an input impedance and an output impedance.

18. The radio transmitter according to claim 17, wherein the control unit is configured to automatically control the input impedance of the ETHF to maximize power transfer from the RF PA stage to the ETHF.

19. The radio transmitter according to claim 17, wherein the control unit is configured to automatically control an output impedance of the ETHF to maximize power transfer from the ETHF to an antenna.

20. The radio transmitter according to claim 14, wherein the at least one RF switch is selected from the group consisting of a CMOS-SOI and a MEMs type of RF switch.

21. A transceiver system including the radio transmitter of claim 14, the transceiver system further including a radio receiver having an input, wherein the ETHF is configured to filter received signals before they are communicated to the input of the radio receiver.

22. The transceiver system according to claim 21, wherein the control unit is configured to dynamically vary at least one filter characteristic of the ETHF when the transceiver system is transitioned between a transmit mode in which the transmitter is active and a receive mode in which the receiver is active.

23. The transceiver system according to claim 22, wherein the at least one filter characteristic is selected from the group consisting of a center frequency, a bandwidth, an input impedance and an output impedance.

24. The radio transmitter according to claim 14, wherein at least one capacitor component of the ETHF is connected between the at least one RF switch and an RF transmit signal path.

25. The radio transmitter according to claim 24, wherein the at least one RF switch is connected between at least one inductor component and the RF transmit signal path.

26. The radio transmitter according to claim 14, wherein the control unit is configured to control a plurality of the RF switches to provide the at least one filter characteristic, and is further configured to select the plurality of RF switches that are active so as to achieve a particular filter characteristic in a way which also maximizes filter Q.

* * * * *